United States Patent [19]

Rodeffer

[11] Patent Number: 4,606,074
[45] Date of Patent: Aug. 12, 1986

[54] AUTOMATIC VOLTAGE LINE LOSS COMPENSATION CONTROL FOR AN ANTENNA RECEIVER

[75] Inventor: Charles E. Rodeffer, Evergreen, Colo.

[73] Assignee: Winegard Company, Burlington, Iowa

[21] Appl. No.: 621,238

[22] Filed: Jun. 14, 1984

[51] Int. Cl.$^4$ ............... H04B 1/18; H04B 1/26
[52] U.S. Cl. ................... 455/131; 455/195; 455/282
[58] Field of Search ................... 455/4–6, 455/131, 280, 282, 195, 283, 315, 323, 338, 226; 507/530; 533/17 R; 358/188, 86

[56] References Cited

FOREIGN PATENT DOCUMENTS 63105   5/1980   Japan ..................... 455/323

OTHER PUBLICATIONS

"Integration Simplifies TVRO Design" by Fornaciari, 3/1981.
Winegard Earth Station Receiver and Converter—Model SC-7035, SC-7035S Instruction Manual—Rev. 10-83.
Lambda 1983 Power Supply Catalog—pp. 34 and 35.

Primary Examiner—Jin F. Ng
Attorney, Agent, or Firm—Robert C. Dorr

[57] ABSTRACT

An automatic control for compensating for the voltage drop between an antenna receiver and a remotely interconnected down converter wherein an operational amplifier senses the voltage drop due to the interconnecting cables, amplifies that voltage, and adds it to the actual tuning voltage to fully compensate for the voltage drop.

4 Claims, 2 Drawing Figures

111
AUTOMATIC VOLTAGE LINE LOSS COMPENSATION CONTROL FOR AN ANTENNA RECEIVER

BACKGROUND OF THE ART

1. Field of the Invention

The present invention relates to an automatic means for compensating for the voltage drop due to line resistance between an antenna receiver and a remotely located down converter and, more particularly, between a satellite dish antenna receiver and its down converter.

2. Discussion of the Prior Art

Recently, the use by consumers of antennas, particularly dish antennas, to receive satellite signals has substantially increased. Most consumers locate the satellite antenna in a convenient location remote from their house. Located at the satellite antenna is a low noise amplifier (LNA) and a down converter. Located at the house of the consumer is a receiver and, of course, the reception set. The receiver is conventionally interconnected with the down converter over two cables. The first cable, usually a pair of conductors, carries power to the down converter from the receiver and the second cable, usually a coaxial cable, carries the received signal from the down converter to the receiver and delivers the tuning voltage from the receiver to the down converter. A problem currently exists with the transmission of the tuning voltage, which is a DC voltage, over the cable to the down converter in that a portion of the voltage will be lost to the resistances of the cable. This cable resistance is a function of the cable length, the temperature of the environment, the overall deterioration of the cable, and the electrical characteristics of the various conventionally available LNAs and down converters. The voltage drop caused by the cable resistances can dramatically affect the tuning oscillator in the down converter and, therefore, it becomes imperative to control this voltage drop.

One conventional approach is to provide a compensation control potentiometer at the output of the tuning voltage from the receiver which can be adjusted by the installer at the site after installation of the LNA, the down converter and the cable. In other words, the installer adjusts the compensation potentiometer so that the signal received by the down converter is the proper tuning voltage. A second conventional approach is to provide a fine tuning circuit in the automatic frequency control (AFC) for the user. The user can set the desired channel and with the fine tune control compensate for any voltage and temperature variations due to cable resistance losses. While these two approaches are conventional and are both currently being used in satellite receivers, they are undesirable in that they do not provide total control over the voltage and temperature variations due to cable resistance losses or to the electrical characteristics of the remote equipment.

The present invention provides an automatic compensation control which eliminates the need for the added expense of the fine tune circuit and the compensation control potentiometer. Furthermore, it does not require any additional wiring or cable between the receiver and the down converter and, therefore, uses only the existing wires. Finally, the control of the present invention is automatic and continuously adjusts the circuit for any variations in cable resistance. In other words, the automatic compensation control of the present invention provides continuous monitoring of the cable resistance and automatically adjusts for cable voltage drops.

SUMMARY OF THE INVENTION

An automatic control for compensating the voltage loss between a satellite antenna receiver and an interconnecting down converter utilizing an operational amplifier with unitary gain located in the receiver wherein the input of the operational amplifier is connected to the ground line of the signal carrying cable being returned from the down converter thereby delivering any voltage attributable to the resistance loss between the receiver and the converter through the operational amplifier and back into the tuning voltage so that the tuning voltage is increased by precisely the amount of the voltage that is lost across the cable pairs.

DETAILED DESCRIPTION

A. Prior Art

Figure 1:
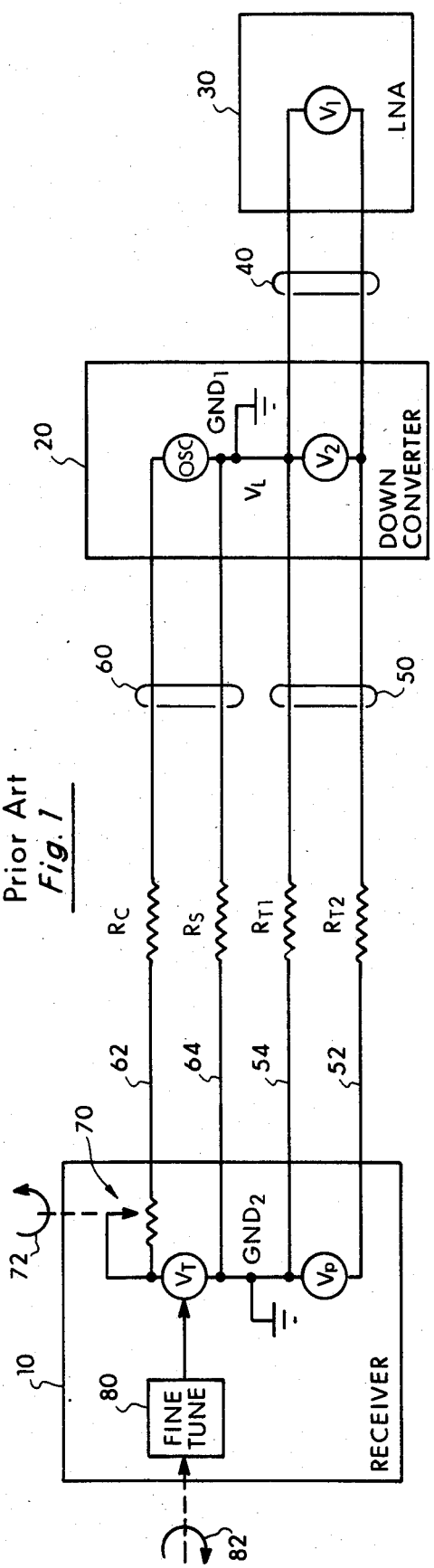
FIG. 1 sets forth the schematic of a prior art approach utilizing a fine tune control and an installer compensation control to adjust for cable voltage loss, and FIG. 2 sets forth the modifications to the prior art circuitry of FIG. 1 incorporating the automatic compensation control of the present invention.

In FIG. 1 is set forth the prior art approach for compensating for cable loss between the receiver 10 and the converter 20. The receiver 10 is typically located in the house or building of the user whereas the down converter 20 is typically located at the site of the satellite antenna. The down converter 20 is connected to the LNA 30 over lines 40. The LNA 30 receives power, $V_1$, over lines 40 from the down converter 20 which in turn receives power, $V_2$, over lines 50 from source $V_p$. In a typical embodiment, 150 mAmp of current are delivered into the LNA 30 and 100 mAmp of current are delivered into the down converter 20. These wires have a resistance loss of $R_{T1}$ and $R_{T2}$ of about approximately 10 ohms per thousand foot.

The cable 60 is coaxial cable having a center conductor 62 and a ground shield 64. Both the ground shield 64 and the center conductor 62 have a resistance loss of approximately 17 ohms per thousand foot which is designated $R_C$ for the center conductor 52 and $R_S$ for the shield 54. The ground shield 64 is connected to ground $GND_1$ at the down converter 20 and also to ground $GND_2$ at the receiver 10. It is to be expressly understood that those circuit portions designated $V_1$, $V_2$, and $V_p$ contained in the LNA 30, the down converter 20, and the receiver 10, respectively, are all conventional and known in the art.

In one prior art approach, the receiver 10 and down converter 20 are sold by Winegard Company, 3000 Kirkwood Street, Burlington, IA 52601 as Models SC-7035 and SC-7035S. And, the LNA 30 is sold by Winegard as Model SC-8101.

The coax wires 60, as mentioned, interconnect the receiver 10 with the down converter 20. The coax 60 interconnects a tuning voltage source $V_T$ to an oscillator, OSC, in the down converter 20. Not shown in this circuit is the conventional circuitry for delivering the received signal (usually 70 MHz) from the down converter 20 to the receiver 10. The voltage source, $V_T$, provides tuning to the down converter in a conventional fashion.

One of the problems in the prior art approach shown in FIG. 1 is the variation of the resistances of $R_T$, $R_S$, and $R_C$ which variations are caused by changes in the temperature, changes in the length of the cables 50 and 60, and deterioration of the cables 50 and 60. Furthermore, the use of different LNAs 30 and different down converters 20 can cause varying currents to flow through cables 50 and 60. Such changes in the resistance or electrical current will cause the tuning voltage, $V_T$, to be adversely affected and to cause the down converter 20 to tune in at different frequencies than those set at the receiver 10.

Two prior art techniques, as mentioned, are available to correct such voltage changes. The first is a compensation control 70 which is a potentiometer that is adjusted by the installer of the system when the installer interconnects the cables 50 and 60 from the receiver to the down converter and installs the LNA 30. This is accomplished by adjusting the potentiometer 70 in the direction of arrow 72 usually with an insulated screwdriver to center the fine tuning range. This control is labeled COMP in the aforesaid Models SC-7035 and SC-7035S. A second correctional circuit is the fine tune circuit 80 which is adjusted by the user of the receiver 10 by turning a potentiometer in the direction of arrow 82. In this fashion, the user of the system can fine tune the receiver 10 and, in part, compensate for the losses in cables 50 and 60. The fine tune control 80 is usually used in conjunction with a signal strength meter. Unfortunately, should significant changes in resistances $R_T$, $R_S$, and $R_C$ occur the fine tune 80 is insufficient to fully rectify the deficiency.

B. Present Invention

Figure 2:
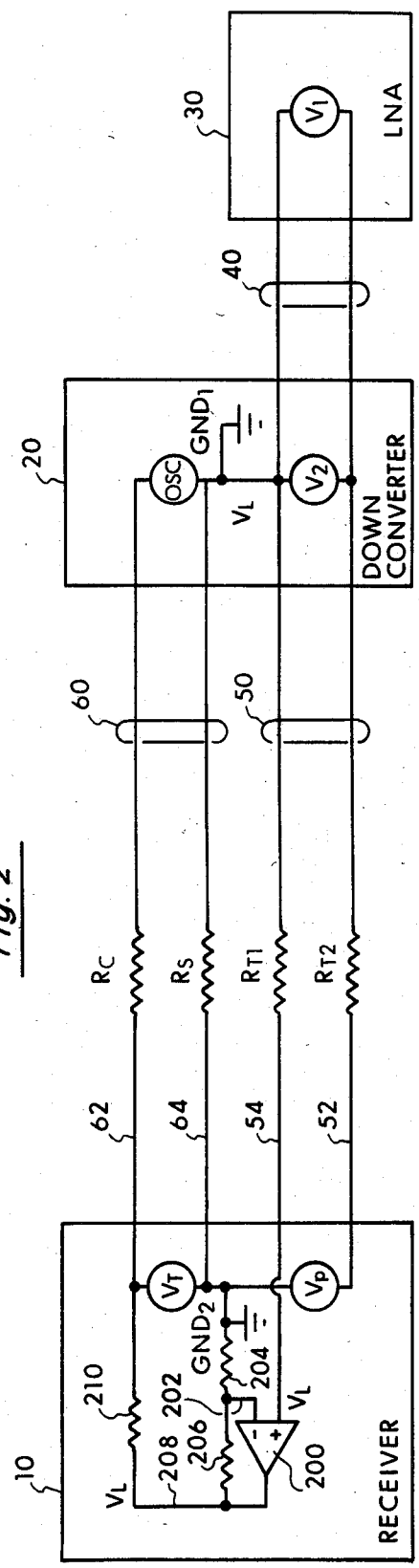

In FIG. 2, is set forth the prior art circuitry of FIG. 1 modified by the present invention. At the outset, it is to be noted that the present invention as shown in FIG. 2 eliminates the need for the compensation control 70 and the fine tune circuit 80 in conventional prior art receivers 10. Furthermore, it is to be also noted that no additional wires or cables are required between the receiver 10 and the down converter 20 as set forth in the prior art approach of FIG. 1. Hence, the present invention achieves an automatic compensation control for the varying line losses $R_T$, $R_S$, and $R_C$ without additional interconnecting cable and through the elimination of the conventional fine tune circuit 80 and the compensation potentiometer 70.

At this point, reference back to FIG. 1 is necessary. In FIG. 1 the voltage difference between GND2 and GND1 is designated $V_L$. $V_L$ is equal to the product of the parallel combination of $R_S$ and $R_{T1}$ and the sum of the LNA and down converter current. It is this voltage $V_L$ that combines with $V_T$ to deliver a resultant signal, $V_T$ minus $V_L$, to the oscillator OSC. Under the teachings of the present invention, and as shown in FIG. 2, connection of wire 54 is changed so that it does not connect to ground GND2 in the receiver, as shown in FIG. 1, but rather to the positive input of operational amplifier 200 located in receiver 10. The negative input of operational amplifier 200 is delivered over line 202 through resistor 204 to ground GND2 and through resistor 206 to the output 208 of the operational amplifier 200. The output 208 is delivered through resistor 210 to the center conductor 62 of cable 60. Resistors 204 and 206 are adjusted to provide unity gain to amplifier 200 so that the input voltage, $V_L$, is delivered to the output on line 208. Hence, a voltage, $V_L$, is automatically added to the tuning voltage $V_T$. The resultant voltage delivered to the oscillator OSC is as follows:

$$(V_L + V_T) - V_L = V_T$$

Hence, the resulting voltage delivered to the oscillator OSC at the down converter 20 is precisely $V_T$ and any voltage drop, $V_L$, which may occur for any of the reasons discussed above over cables 50 and 60 is automatically and immediately compensated for under the teachings of the present invention.

This not only results in savings in the circuitry of the receiver 10 by the elimination of the fine tune circuit 80 and the compensation control 70, but it also saves in time and labor in having the installer adjust the compensation control 70 and the inconvenience to the user in having to adjust the fine tune control 80. In addition to these benefits, the automatic compensation control of the present invention provides for more accurate tuning without the addition of any extra cables or wires between the down converter 20 and the receiver 10.

In the preferred embodiments, the operational amplifier is manufactured by Motorola as Model No. MC-1741.

While the present invention has been presented with a particularly degree of specificity it is to be expressly understood that changes and modifications can be made thereto without departing from the spirit and scope of the claims that follow.

I claim:

1. An automatic control for compensating for the voltage drop, ($V_L$) between an antenna receiver (10) and an interconnecting down converter (20), said receiver (10) having a first cable (60) providing a tuning voltage, ($V_T$), over one line (62) and providing receiver ground (GND2) over a second line (64) and having a second cable (50) providing power ($V_p$), over one line 52 and a down converter ground (GND1) over a second line (54), said receiver ground (GND2) on said receiver ground line (64) being connected to said ground (GND1) at said down converter (20), said automatic compensation control comprising:

an operational amplifier (200) located in said receiver (10) having its positive input connected to said down converter ground line (54) carrying said voltage drop ($V_L$) above said ground (GND2) from said down converter (20) and having its negative input connected through a first resistor (206) to its output (208) and through a second resistor (204) to said receiver ground (GND2), said operational amplifier (200) having unity gain, and the output (208) of said operational amplifier (200) being connected to said tuning voltage line (62) so that the value of said voltage drop, ($V_L$), is added to the tuning voltage, ($V_T$), to fully compensate for said voltage drop, ($V_T$).

2. An automatic control for compensating for the voltage drop, ($V_L$), between an antenna receiver (10) and an interconnecting down converter (20), said receiver (10) having a first cable (60) providing a tuning voltage, ($V_T$), over one line (62) and providing receiver ground (GND2) over a second line (64) and having a second cable (50) providing power ($V_p$), over one line (52) and a down converter ground (GND1) over a second line (54), said receiver ground (GND2) on said receiver groundline (64) being connected to said down converter (20), said automatic compensation control comprising:

an operational amplifier (200) located in said receiver having its positive input connected to said down converter ground line (54) carrying said voltage drop, ($V_L$), above said ground (GND2) from said down converter (20) and having its negative input connected through a first resistor (206) to its output (208) and through a second resistor (204) to said receiver ground (GND2), and the output (208) of said operational amplifier (200) being connected to said line (62) so that the value of said voltage drop, ($V_L$), is added to the tuning voltage, ($V_T$) to fully compensate for said voltage drop, ($V_T$).

3. An automatic control for compensating for the voltage drop, ($V_L$) between an antenna receiver (10) and an interconnecting down converter (20), said receiver (10) having a first cable (60) providing a tuning voltage, ($V_T$), over one line (62) and providing receiver ground (GND2) over a second line (64) and having a second cable (50) providing power ($V_p$), over one line (52) and a down converter ground (GND1) over a second line (54), said receiver ground (GND2) on line (64) being connected to said down converter (20), said automatic compensation control comprising:

an operational amplifier (200) located in said receiver having its input connected to said down converter ground line (54) carrying said voltage drop, ($V_L$), above said ground (GND2), from said down converter (20), said output of said operational amplifier (200) being connected back to said tuning voltage line (62) so that the value of said voltage drop, ($V_L$), is added to the tuning voltage ($V_T$), to fully compensate for said voltage drop, ($V_L$).

4. An automatic control for compensating for the voltage drop, ($V_L$) between an antenna receiver (10) and an interconnecting down converter (20), said receiver (10) having a first cable (60) providing a tuning voltage, ($V_T$), over one line (62) and providing receiver ground (GND2) over a second line (64) to the down converter ground (GND1), said automatic compensation control comprising:

means (200) being connected to said down converter ground (GND1) carrying said voltage drop ($V_L$) above said ground (GND2) from said down converter (20) for delivering said voltage drop ($V_L$) back to said tuning voltage line (62) so that the value of said voltage drop ($V_L$) is added to the tuning voltage ($V_T$) to fully compensate for said voltage drop ($V_L$).

* * * * *